(12) United States Patent
Spirkl

(10) Patent No.: US 6,639,862 B2
(45) Date of Patent: Oct. 28, 2003

(54) SEMICONDUCTOR MEMORY WITH REFRESH AND METHOD FOR OPERATING THE SEMICONDUCTOR MEMORY

(75) Inventor: Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/105,547

(22) Filed: Mar. 25, 2002

(65) Prior Publication Data

US 2002/0136077 A1 Sep. 26, 2002

(30) Foreign Application Priority Data

Mar. 23, 2001 (DE) .......................... 101 14 280

(51) Int. Cl.[7] .............................................. G11C 7/00
(52) U.S. Cl. .................................. 365/222; 365/208
(58) Field of Search ................................ 365/205, 207, 365/208, 222, 226, 227

(56) References Cited

U.S. PATENT DOCUMENTS

| 4,831,597 | A | * | 5/1989 | Fuse ........................... 365/233 |
|---|---|---|---|---|
| 5,526,319 | A | | 6/1996 | Dennard et al. ............ 365/226 |
| 5,561,626 | A | * | 10/1996 | Fujii .......................... 365/149 |
| 5,631,872 | A | | 5/1997 | Naritake et al. ............ 365/227 |
| 5,748,547 | A | * | 5/1998 | Shau .......................... 365/222 |
| 6,385,120 | B1 | * | 5/2002 | Steiss ........................ 365/229 |

OTHER PUBLICATIONS

Tee, L. et al.: "Charge Recovery and Adiabatic Switching Techniques in Digital Logic", IEEE, 1994, pp. 1–6.

\* cited by examiner

*Primary Examiner*—Son Mai
(74) *Attorney, Agent, or Firm*—Laurence A. Greenberg; Werner H. Stemer; Ralph E. Locher

(57) ABSTRACT

To carry out a refresh operation, a semiconductor memory having dynamic memory cells includes a sense amplifier that, on the output side, provides a signal depending on a control of a bit line driver. The bit line driver is embodied as an adiabatic amplifier, preferably, having current paths through which charges that are to be exchanged during a charge-reversal operation are buffer-stored in capacitors. Power loss for the charge reversal of the bit line capacitances is thereby saved. A method for operating the memory is also provided.

15 Claims, 5 Drawing Sheets

FIG. 1A
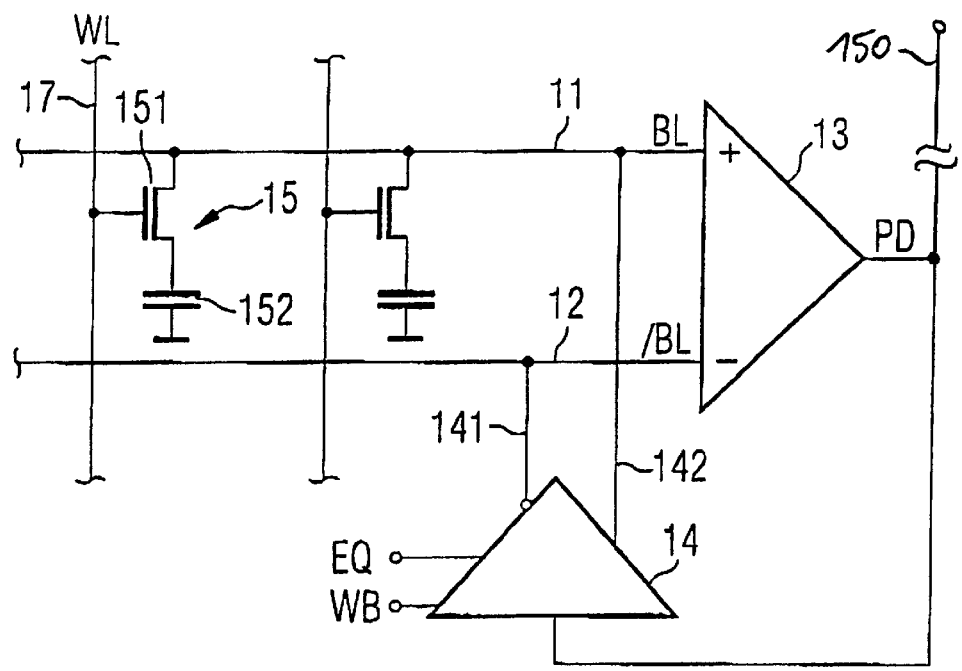
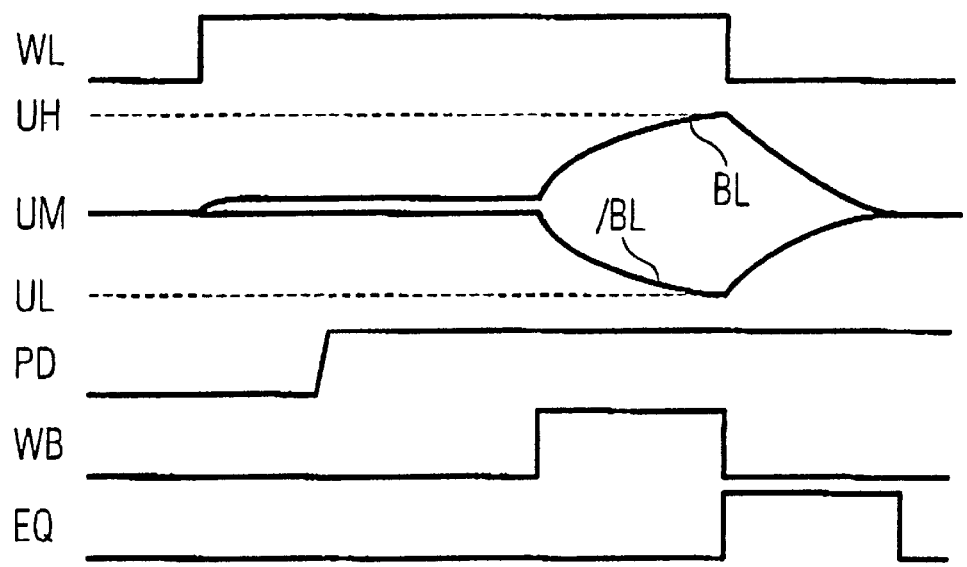
FIG. 1B

FIG. 4A
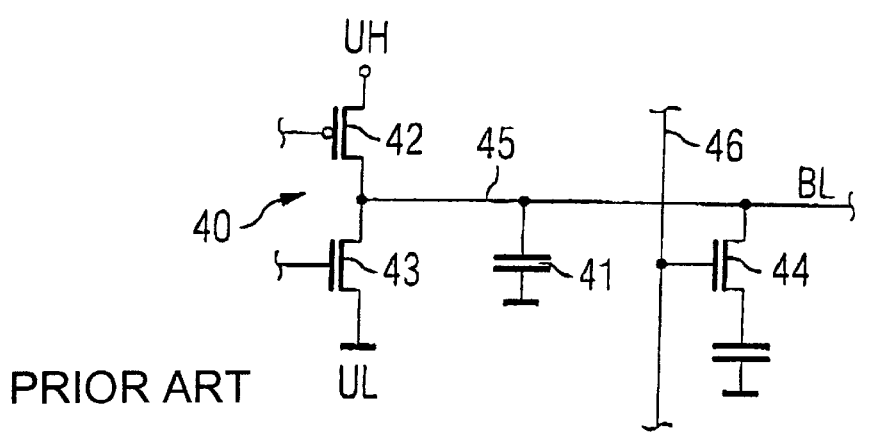
PRIOR ART
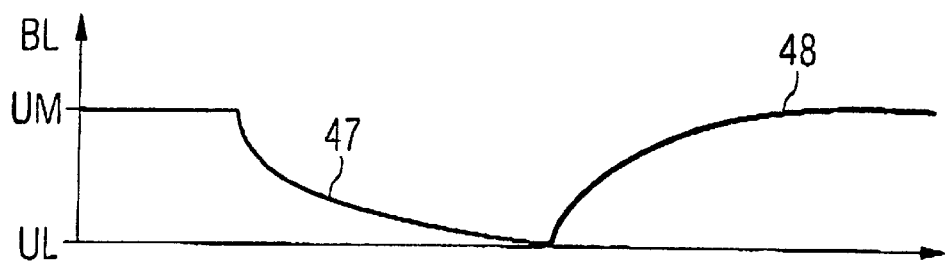
FIG. 4B

SEMICONDUCTOR MEMORY WITH REFRESH AND METHOD FOR OPERATING THE SEMICONDUCTOR MEMORY

BACKGROUND OF THE INVENTION

Field of the Invention

The invention lies in the field of integrated circuits. The invention relates to a semiconductor memory in which memory cells are refreshed again through an amplifier. The invention additionally relates to a method for operating such a semiconductor memory.

In dynamic semiconductor memories, each of the memory cells includes a selection transistor with a storage capacitor. The storage capacitor can be connected to a bit line through the selection transistor, so that the charge content of the memory cell can be read out or written in. The selection transistor can be driven through a word line. By activation of the word line and selection of the bit line, an access is made to the memory cell disposed at the crossover of the word and bit lines. A sense amplifier is connected to the bit line so that the relatively small charge content of the memory cell is amplified by the sense amplifier to form a full-level signal and is, thus, available for further processing in the semiconductor memory.

The charge content of the storage capacitor is volatile due to the incomplete insulation of the capacitor within the integrated circuit and the leakage currents established as a result. Therefore, the charge content must be refreshed again with specific time intervals. In dynamic semiconductor memories, the operation of refreshing them again is also referred to as refresh. During the refresh, the bit line is firstly brought to an equalization level lying, for example, in the middle of the fully driven high level and low level. Afterward, as a result of the selection transistor being switched on, the capacitor of the memory cell to be refreshed is connected to the bit line. The charge content of the storage capacitor slightly displaces the equalization level of the line in accordance with the stored charge state. Such asymmetry is then amplified by the sense amplifier and subsequently output as an amplified signal onto the bit line and thereby written back again to the storage capacitor of the memory cell to be refreshed. Such an operation is likewise applied to all the other memory cells. If the quantity of charge stored in the memory cell under consideration has decreased again, the refresh operation is repeated on the memory cell.

It should be stressed that the parasitic capacitance formed by the bit line is a multiple of the relatively small capacitance of the storage capacitor of a connected memory cell. By way of example, the ratio of bit line capacitance to the capacitance of one of the memory cells amounts to 10:1. During a refresh operation, the bit line capacitance, proceeding from the equalization level, is subjected to charge reversal to a high or low level in accordance with the stored data value and is subsequently returned to the equalization level again. Due to the relatively large bit line capacitance, the current consumption brought about by these charge-reversal operations is substantially determined by the magnitude of the bit line capacitance, whereas the refreshing of the leakage current losses of the storage capacitor is pushed into the background. Thus, the power loss consumption during a refresh cycle is substantially taken up by the parasitic currents for the charge reversal of the bit line capacitances and the provision of these currents from the supply voltage.

When dynamic semiconductor memories are used in devices whose supply voltage is provided by a battery, the battery life is also limited during low-power-loss standby operation. A relatively high power loss is already consumed by the refresh cycles of the dynamic semiconductor memory. It is noticeable that the power loss consumption for the refresh is substantially brought about by the charge reversal of the parasitic bit line capacitance. The possibilities for using dynamic semiconductor memories in power-loss-critical applications are, therefore, limited.

U.S. Pat. No. 5,526,319 to Dennard et al. describes a semiconductor memory having conventional sense amplifiers and, moreover, a cyclic power source. The cyclic power source is connected to an input terminal of the sense amplifier through a switch. The switch is controlled by an enable signal so that the cyclic power source is available for reading out the data on the bit lines.

SUMMARY OF THE INVENTION

It is accordingly an object of the invention to provide a semiconductor memory with refresh and method for operating the semiconductor memory that overcomes the hereinafore-mentioned disadvantages of the heretofore-known devices and methods of this general type and that has a power loss consumption as low as possible during the refresh.

With the foregoing and other objects in view, there is provided, in accordance with the invention, a semiconductor memory including at least one memory cell, a bit line connected to the memory cell, a sense amplifier having an output, the sense amplifier connected to the bit line, amplifying a signal read from the memory cell, and generating, at the output, an output signal derived from the signal, and an adiabatic amplifier connected to the bit line and to the output and driven by the output signal of the sense amplifier to write back the signal read from the memory cell to the memory cell in amplified form dependent upon the output signal of the sense amplifier.

The semiconductor memory has a normal operating mode, in which customary memory accesses, i.e., writing and reading of data values to and from memory cells, are carried out. Also provided is a standby operating mode with relatively low power loss consumption. During the standby operating mode, data are not input or output externally, rather all that is effected is the internal charge retention of the dynamic memory cells. During such a phase, for the purpose of carrying out the refresh operations, the adiabatic amplifier is used so that the bit line capacitances are subjected to charge reversal in a manner exhibiting a low power loss. During the low-power-loss standby operating mode, there is sufficient time available for the adiabatic amplifier to carry out an amplification operation. An amplification operation by the adiabatic amplifier takes longer than an amplification operation carried out by a normal sense amplifier.

In the case of the semiconductor memory according to the invention, an adiabatic amplifier is used for driving an amplified level onto the bit lines. A conventional characteristic of the adiabatic amplifier is that, in the event of a level transition in one direction, at least part of the reduced quantity of charge is buffer-stored in one or more capacitors and is subsequently output again in the event of a level change in the opposite direction. A level change is composed step-by-step of a plurality of charge-reversal operations into a capacitor or from a capacitor onto the circuit node to be subjected to charge reversal. Current is drawn from the supply voltage only for the final charge-reversal step so that the present level is driven fully to the supply voltage. The current consumption for traversing a level swing from the initial level to the target level and back to the initial level consumes only little current on account of the buffer-storage in capacitors. Power loss is thereby saved. Compared with conventional concepts in which the bit line is driven by an inverter, for example, more time is admittedly taken up for the charge transition from the capacitor into the circuit node to be subjected to charge reversal, the bit line in this case. Nevertheless, because there is sufficient cycle time available for a refresh cycle, the longer time duration required by an adiabatic charge-reversal operation compared with conventional concepts is not a hindrance.

Concepts for adiabatic amplifiers are described in the literature reference Luns Tee, Lizhen Zheng "Charge Recovery and Adiabatic Switching Techniques in Digital Logic". Through the use of the adiabatic circuit concept for the charge reversal of the bit lines during a refresh cycle, power loss is substantially saved so that the semiconductor memory can now be used in power-loss-critical systems, for example, in battery-operated devices. A dynamic semiconductor memory can then also be used for the permanent storage of information in battery-operated devices.

The adiabatic amplifier is connected to the bit line on the output side and is driven by the sense amplifier on the input side. The sense amplifier prescribes the level that is to be written back onto the bit line and to the storage capacitor currently being read, and generates the corresponding control signals for the amplification operation. As in the prior art, the bit lines are organized in pairs, a bit line pair being connected to complementary inputs of a sense amplifier and one of the bit lines carrying the information that is to be stored in a non-inverted fashion (true bit line), while the other bit line of the bit line pair carries the information that is to be stored in an inverted fashion (complementary bit line). The adiabatic amplifier is connected to the complementary bit lines on the output side.

In accordance with another feature of the invention, the adiabatic amplifier has first and second output terminals, a further bit line is connected to the sense amplifier, and the first and second output terminals of the adiabatic amplifier are respectively connected to the bit line and the further bit line.

In accordance with a further feature of the invention, the adiabatic amplifier has at least three current paths connected between the bit line and the further bit line, each of the current paths have a series circuit of controlled paths of two transistors with a coupling node, the coupling node of the transistors for two of the current paths is connected to a respective terminal for a supply potential, and a capacitive element is connected to the coupling node of the transistors for another of the current paths.

Preferably, the adiabatic amplifier has at least three current paths connected between the complementary bit lines. Each of the current paths contains the series circuit of the controlled paths, i.e., the drain-source paths, of two transistors. The coupling node of the transistors is connected to the positive supply potential, which forms the high level, in the case of the first of the current paths. The coupling node of the second of the current paths is connected to reference-ground potential or ground, which forms the low level. The coupling node of the transistors of the third current path is connected to a capacitor. At the other ends the capacitor is connected to reference-ground potential or ground. The control terminals of the transistors, i.e., the gate terminals, are controlled by a control device in a suitable manner to carry out a charge-reversal operation. During the charge-reversal operation for a refresh cycle on a memory cell, the bit line, which is initially at an equalization potential preferably lying in the middle between the positive supply potential and ground, is brought to the positive supply potential or to ground potential in a manner dependent on the data value to be restored. Afterward, the bit line is returned from this high or low level to the equalization potential again. The other bit line of the bit line pair undergoes exactly the opposite charge-reversal operation. Because the adiabatic amplifier is connected to the complementary bit lines on the output side and the above-mentioned current paths lie between these terminals, it is advantageously possible for the quantity of charge carried away by one bit line to be buffer-stored in the capacitor in a first operating clock cycle and to be transferred to the other of the bit lines in a subsequent operating clock cycle. The transition to the complete high or low level, that is to say, positive supply potential or ground, is achieved in that the respective bit line is connected to the terminal for the positive supply potential or ground potential, respectively, through the respective switch. Only during this last-mentioned operating clock cycle of the adiabatic amplification is current drawn from the supply voltage. In all other operating clock cycles, the charge is transferred from the bit line into the capacitor or is output from the capacitor onto the other of the bit lines of the bit line pair. As a result, power loss is substantially saved.

In accordance with an additional feature of the invention, the transistors have control terminals and a control device has an output side connected to the control terminals of the transistors to control an adiabatic amplification operation of complementary signals on the bit lines dependent upon the output signal of the sense amplifier.

In accordance with yet another feature of the invention, there are provided further capacitive elements and at least two further current paths are connected between the first and second output terminals, each of the further current paths having two transistors with a coupling node, the two transistors connected in series by controlled paths, the coupling node connected to a respective one of the further capacitive elements.

In continuation of the principle described, even further current paths with series-connected, controlled paths of transistors and capacitors at the coupling node of the transistors can be connected in parallel with the previous current paths, that is to say, between the output terminals of the adiabatic amplifier. By way of example, two further current paths may be provided, or generally an arbitrary number of further current paths connected in parallel. The further current paths form intermediate levels for the level transitions during a charge-reversal operation, once again only the respective final charge-reversal operation to ground potential or to the positive supply potential drawing a current from the supply voltage. By virtue of the further current paths and capacitors, the intermediate level stages are more finely gradated, so that the current loss to be provided from the supply voltage decreases with an increasing number of current paths, because the partial level to be equalized is smaller. By way of example, with a total of five current paths connected in parallel, the current consumption is reduced to just a quarter relative to a conventional concept. Otherwise, the amplification operation is effected by charge-reversal operations between the complementary bit lines. In the case of the above-mentioned five current paths connected in parallel in the adiabatic amplifier, of which two current paths are connected to the poles of the supply voltage and three current paths are connected to a respective capacitor, three intermediate levels lying between a fully driven high level (positive supply voltage) and a fully driven low level (ground) are introduced, namely at 1/4*UH, 1/2*UH, 3/4*UH, where UH is the high level or the positive supply potential.

In accordance with an added feature of the invention, the control device has a read-only memory and a counter connected to and driving the read-only memory and the read-only memory has an output side connected to the control terminals of the transistors.

In accordance with yet a further feature of the invention, the sense amplifier is a plurality of sense amplifiers, a plurality of bit line pairs are respectively connected to one of the sense amplifiers, the adiabatic amplifier is a single adiabatic amplifier with an input side and an output side, the input side of the single adiabatic amplifier is connected to the sense amplifiers, the single adiabatic amplifier is driven by each of the sense amplifiers, at least one controllable switching device is connected to the output side of the single adiabatic amplifier, the switching device is connected to bit lines of the bit line pairs for connecting the output side of the single adiabatic amplifier to the bit lines of the bit line pairs, and the switching device is programmed to drive a respective one of the bit line pairs based upon the output signal from a respective one of the sense amplifiers connected to the one of the bit line pairs and fed to the single adiabatic amplifier by the single adiabatic amplifier through the switching device.

In accordance with yet an added feature of the invention, for an output signal directly sent to the single adiabatic amplifier from one of the sense amplifiers connected to a respective one of the bit line pairs, the switching device is programmed to drive the one of the bit line pairs with the single adiabatic amplifier through the switching device.

In accordance with yet an additional feature of the invention, the memory cell has a selection transistor and a storage capacitor and the adiabatic amplifier refreshes a charge content of the storage capacitor.

For the purpose of driving the switches of the adiabatic amplifier, a counter, for example, is provided, which drives the memory cells of a read-only memory (ROM). The outputs of the read-only memory are connected to the gate terminals of the transistors of the adiabatic amplifier and are switched on and off in a manner dependent on the data values read from the read-only memory. The counter is triggered by a refresh signal. The sequence of control signals for driving the transistors that is to be read from the read-only memory depends on the charge-reversal operation to be carried out, that is to say, on the state of the data value to be refreshed. This information is supplied by the sense amplifier, which is also connected to the bit line pair, and is communicated to the read-only memory at one of its address inputs.

Compared with a conventional inverter stage for driving a bit line for the charge reversal during a refresh cycle, an adiabatic amplifier has a larger number of components and, consequently, a larger area occupation in an integrated realization on the semiconductor memory chip. However, it suffices for the adiabatic amplifier to be associated with a multiplicity of bit line pairs for carrying out the refresh operation. Thus, only a single adiabatic amplifier is provided for the multiplicity of bit line pairs, which amplifier, on the input side, is driven by the sense amplifiers respectively connected to the bit line pairs and which amplifier, on the output side, is in each case only ever connected, through corresponding switching device, to one of the bit line pairs, namely that pair by whose connected sense amplifier it is currently being driven on the input side. The data value to be refreshed is then communicated to the single adiabatic amplifier through the respective sense amplifier, with the result that the switching device, e.g., a demultiplexer, connects the output of the adiabatic amplifier to the bit line pair to which the memory cell to be refreshed is connected. Therefore, the adiabatic amplifier can be used jointly for a multiplicity of bit line pairs. Because the memory cells are organized in blocks, adiabatic amplifiers can be used jointly for the refresh operation of different blocks. It is also expedient within a block to associate an adiabatic amplifier to a plurality of bit line pairs.

With the objects of the invention in view, there is also provided a two-mode semiconductor memory including at least one memory cell having a selection transistor and a storage capacitor, a bit line connected to the memory cell, a sense amplifier having an output, the sense amplifier connected to the bit line, amplifying a signal read from the memory cell, and generating, at the output, an output signal derived from the signal, an adiabatic amplifier connected to the bit line and to the output and driven by the output signal of the sense amplifier to write back the signal read from the memory cell to the memory cell in amplified form dependent upon the output signal of the sense amplifier, the adiabatic amplifier refreshing a charge content of the storage capacitor, and a first operating mode carrying out a reading or writing access of a data value at the memory cell with a relatively high power loss consumption and a second operating mode refreshing the data value stored in the memory cell through the adiabatic amplifier with a relatively lower power loss consumption.

In accordance with again another feature of the invention, the second operating mode refreshes the data value with relatively substantially lower power loss consumption With the objects of the invention in view, there is also provided a method for operating a semiconductor memory including the steps of providing a two-mode semiconductor memory having at least one memory cell, a bit line connected to the memory cell, a sense amplifier having an output, the sense amplifier connected to the bit line, and an adiabatic amplifier connected to the bit line and to the output of the sense amplifier, generating an output signal derived from the signal at the output of the sense amplifier, in a first operating mode, amplifying a signal read from the memory cell with the sense amplifier and providing the signal at an external output terminal of the semiconductor memory, and in a second operating mode, feeding the output signal of the sense amplifier to the adiabatic sense amplifier to control, dependent upon the output signal of the sense amplifier, the adiabatic sense amplifier such that the signal read from the memory cell is written back to the memory cell again after adiabatic amplification.

In accordance with again a further mode of the invention, the first operating mode is carried out as a normal operating mode of the memory and the second operating mode is carried out as a power-saving mode of the memory, the power-saving mode having a relatively lower power loss compared to a power loss of the normal operating mode.

In accordance with a concomitant mode of the invention, the first operating mode is a normal operating mode of the memory and the second operating mode is a power-saving mode of the memory having a relatively lower power loss compared to a power loss of the normal operating mode.

Other features that are considered as characteristic for the invention are set forth in the appended claims.

Although the invention is illustrated and described herein as embodied in a semiconductor memory with refresh and method for operating the semiconductor memory, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1A is a fragmentary, schematic circuit diagram of a dynamic semiconductor memory with an adiabatic amplifier for the refresh operation together with signal profiles according to the invention FIG. 1B is a signal flow graph of the circuit of FIG. 1A;

FIG. 4A is a fragmentary, schematic circuit diagram of a prior art amplifier;

FIG. 4B is a graph illustrating the equalization potential, discharge curve, and charging curve of the amplifier of FIG.

DESCRIPTION OF THE PREFERRED EMBODIMENTS

Figure 2A:
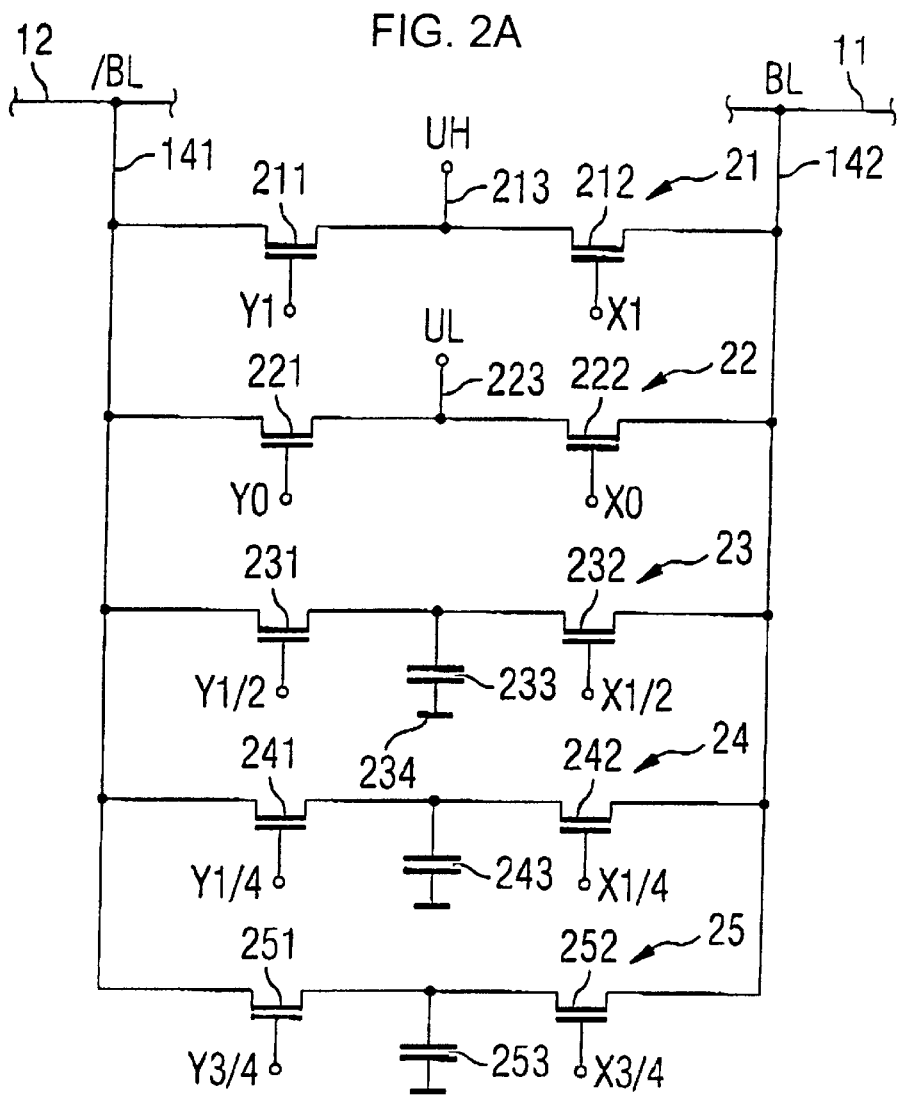
FIG. 2A is a fragmentary, schematic circuit diagram of an adiabatic amplifier according to the invention.

Referring now to the figures of the drawings in detail and first, particularly to FIGS. 4A and 4B thereof, there is shown a memory cell 44 is connected to a bit line 45 and also to a word line 46. The memory cell 44 conventionally has a selection transistor and also a storage capacitor. The bit line 45 has a parasitic capacitance 41. The charge stored in the storage capacitor of the memory cell 44 is reduced due to leakage currents. At the start of the refresh operation, the bit line 45 is charged to the equalization potential UM disposed in the middle between the high level UH and the low level UL. The selection transistor of the memory cell 44 is then turned on by activation of the word line 46 and the storage capacitor is connected to the bit line 45. The relatively small signal output from the storage capacitor onto the bit line 45 is amplified by a non-illustrated sense amplifier that drives a bit line driver 40. By way of example and referring to FIG. 4B, a low level UL is stored in the memory cell 44. The transistor 43 of the bit line driver 40 is then turned on and the bit line 45 is discharged along the discharge curve 47. The amplified level is thereby written back to the storage capacitor of the memory cell 44 through the selection transistor in the on state. Afterward, closing the word line 46 turns off the selection transistor. The bit line 45 is then brought to the equalization level UM along the charging curve 48. For such a purpose, the bit line 45 is charged from the positive supply voltage UH. The quantity of charge to be made available from the supply voltage amounts to UM*CBL, which represents the parasitic bit line capacitance 11.

The detail from a semiconductor memory having dynamic memory cells that is illustrated in FIG. 1A has a pair of bit lines 11, 12, of which the memory cells connected to the bit line 11 store the information in a non-inverted fashion and the memory cells connected to the bit line 12 store the information in an inverted fashion. By way of example, the memory cell 15 is refreshed. The memory cell 15 has a storage capacitor 152 and also a selection transistor 151. The selection transistor is turned on by activation of the word line 17. The signal output onto the bit line 11 is amplified in a primary sense amplifier 13 connected directly to the bit line pair 11, 12. The output signal PD of the sense amplifier 13 controls the bit line driver 14, which, on the output side, is, in turn, connected to the bit lines 11, 12. The bit line driver 14 is an adiabatic amplifier, as is explained in detail below.

As can be gathered from the signal profiles of FIG. 1B, the levels BL, /BL of the bit lines 11, 12 are initially equalized with respect to one another and lie at the equalization potential UM. With the activation of the word line WL, the level BL of the word line 11 is displaced slightly toward positive values, that is to say, a logic "1" is read out. The sense amplifier 13 generates a high level for its output signal PD. The write-back signal WB initiates the driving of the bit lines 11, 12 by the adiabatic amplifier 14. The potentials of the bit lines BL, /BL are then amplified up to the complete, saturated high level UH and to the complete, saturated low level UL, so that the charge state for a logic "1" is written back to the storage capacitor 152 in an amplified fashion through the transistor 151 which is still in the on state. Afterward, both the write-back signal WB and the word line control signal WL are deactivated. The potential of the bit lines 11, 12 is subsequently equalized again by the signal EQ and brought to the equalization level UM.

During normal operation, the sense amplifier 13 forwards the output signal that it has amplified to an output terminal 150 of the semiconductor memory through the read-out data path. At the output terminal 150, the data signal read from the memory cell 15 can be tapped off externally with respect to the memory. A signal is advantageously read out through the read-out data path during normal operation, that is to say, if a data value is to be provided at the output terminal 150 in response to a read command that can be fed in externally. During low-power-loss standby operation, no data are interrogated externally, so that the output signal PD of the sense amplifier 13 is fed to the adiabatic amplifier 14 in order to carry out, by the adiabatic amplifier 14, a refresh operation for the information stored in the memory cells. The memory cells are volatile memory cells whose charge content decreases through leakage currents. To ensure that the stored information is not lost, the charge content of the memory cell has to be refreshed again after a specific time. The refresh operation during the standby operating time is effected using the adiabatic amplifier. The adiabatic amplifier amplifies the signals more slowly than the normal sense amplifiers, but it saves power loss.

Figure 2B:
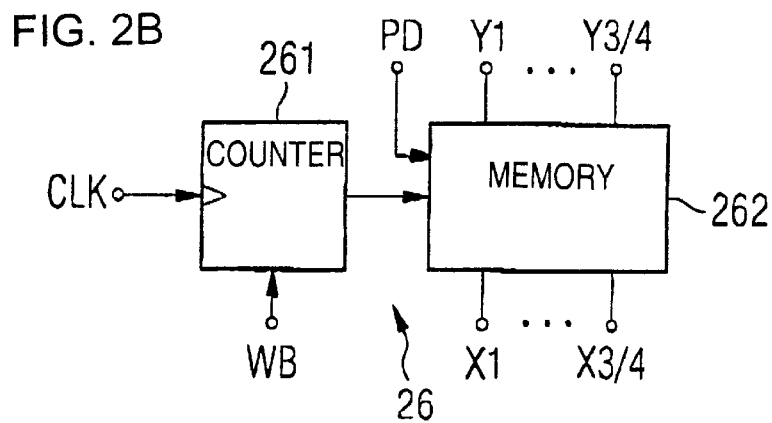
FIG. 2B is a block circuit diagram of a control device for the adiabatic amplifier of FIG. 2A.

The adiabatic amplifier 14 is illustrated in detail in FIG. 2. A terminal 141 is connected to the complementary bit line 12 and a terminal 142 is connected to the non-inverted bit line 11. Five current paths 21, 22, 23, 24, 25 are connected between the terminals 141, 142. The first current path includes two n-channel MOS transistors 211, 212 that are connected in series by their drain-source paths. The coupling node between the transistors 211, 212 is connected to a terminal 213 for the positive supply potential, which, at the same time, also forms the logic high level UH. The second current path 22 includes two n-channel MOS transistors 221, 222 that are connected in series by their drain-source paths. The coupling node between the transistors 221, 222 is connected to a terminal 223 for the low level UL, which is formed by ground in this case.

The current path 23 includes two n-channel MOS transistors 231, 232 connected in series. Their coupling node is connected through a capacitor 233 to a terminal 234 for ground potential. In a corresponding manner, the current path 24 has two n-channel MOS transistors 241, 242 connected in series, their coupling node being connected to ground through a capacitor 243. The current path 225 has two transistors 251, 252 connected in series, with a capacitor 253 connected between the transistors 251, 252 and connected to ground. The gate terminals of the transistors 211, ..., 252 are driven by a control device 26 (see FIG. 2B) on the output side to carry out the refresh operation described in connection with FIGS. 1A and 1B.

On the address side, a counter 261 controls a read-only memory 262 which, on the output side, provides the control signals Y1, ..., X3/4 for all the transistors of the adiabatic amplifier. The counter 261 receives an operating clock signal CLK. It is started when the amplification operation on the bit lines 11, 12 is initiated by activation of the signal WB. In a manner dependent on the signal PD provided by the output of the sense amplifier 13, a corresponding sequence of signal states for the drive signals Y1, ..., X3/4 is provided in order to supply the charge content of the memory cell 15 in an amplified fashion on the bit lines. The output signal PD of the primary sense amplifier 13 specifies the information "0" or "1" stored in the selected memory cell 15. The signal PD has two logic states. In a manner dependent on the signal PD, the adiabatic amplifier 14 is controlled such that it either provides a corresponding signal sequence in order, proceeding from the equalization level UM, to drive a high level on one of the bit lines, e.g., BL, and to drive a low level on the other of the bit lines, e.g., /BL, and in order subsequently to reach the equalization level again. If the other state of the signal PD is fed to the adiabatic amplifier 14, then the bit line signal BL is driven to a low level and the bit line signal /BL of the complementary bit line is driven to a high level. The output signal PD of the primary sense amplifier 13 thus controls the type of transitions between the signal levels that the adiabatic amplifier 14 is intended to control.

Accordingly, the bit lines 11, 12 are at the equalization level UM during the phase T0, during the phase T1, the control signals X3/4 and Y1/4 are activated, so that the transistors 241 and 252 are turned on. See FIG. 3. All the other switching transistors of the adiabatic amplifier are turned off. As a result, the complementary bit line 12 is connected to the capacitor 243 and the potential of the bit line 12 is decreased along the discharge curve 31 to the level U1/4. In a complementary manner with respect thereto, the non-inverted bit line 11 is connected through the switch 252 in the on state to the capacitor 253 and the quantity of charge stored therein is output onto the bit line 11, so that the potential of the bit line 11 rises along the charging curve 32 to the level U3/4. In the subsequent operating clock cycle T2, the signals X1, Y0 are activated and the transistors 212, 221 are, thus turned on. This means that the inverted bit line 12 is operated through the switch 221 in the on state with the low level UL and discharges along the discharge curve 33 from the previous potential U1/4 to the low level UL. The non-inverted bit line 11 is driven by the high level UH by the transistor 212 in the on state and is charged along the charging curve 34 from the previous level U3/4 to the high level UH. The logic level "1" read from the memory cell 15 is now present in an amplified fashion as level UH on the non-inverted bit line 11 and as complementary level UL on the inverted bit line 12. The amplified level UH is written to the storage capacitor 152 through the selection transistor 151 in the on state. At the end of the clock phase T2, the word line signal WL on the word line 17 is deactivated and the selection transistor 151 is turned off. The amplified logic level is now frozen in the storage capacitor 152 and falls at most through leakage currents in the semiconductor substrate. The write-back operation is ended by deactivating the control signal WB at the end of the clock phase T2.

The level between the bit lines 11, 12 is now equalized and brought back to the equalization level UM. The equalization control signal EQ is activated. Moreover, the control signals X3/4 and Y1/4 are activated, so that the transistors 252 and 241 are turned on. The capacitor 253 is thereby connected to the non-inverted bit line 11 and the bit line 11 is discharged into the capacitor 253 along the discharge curve 36. On the other hand, the capacitor 243 is connected to the inverted bit line 12 and the bit line 12 is charged from the capacitor 243 in accordance with the characteristic curve 35. Finally, the signals X1/2 and Y1/2 are activated, so that the capacitor 233 is connected to the non-inverted bit line 11 and the capacitor 233 is additionally connected to the inverted bit line 12. As a result, the bit lines 11, 12 are short-circuited to one another and brought to equalization potential UM. The equalization operation is now concluded and the signal EQ is switched off.

Figure 3:
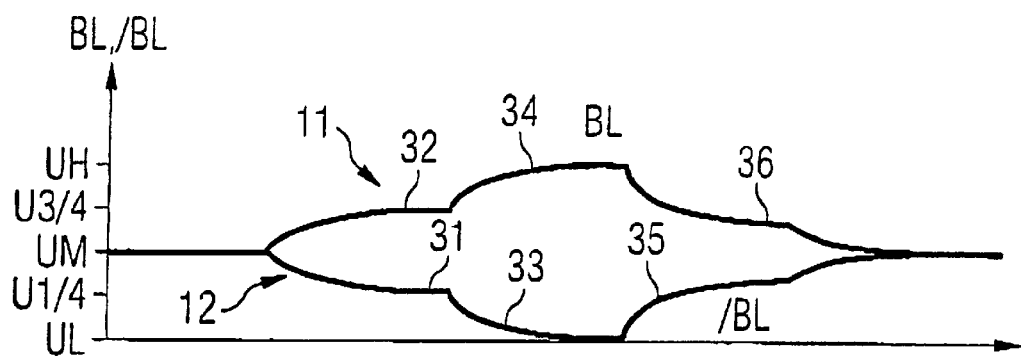
FIG. 3 is a signal flow diagram for the control of the amplification operations within the adiabatic amplifier of FIGS. 2A and 2B.
Figure 3:
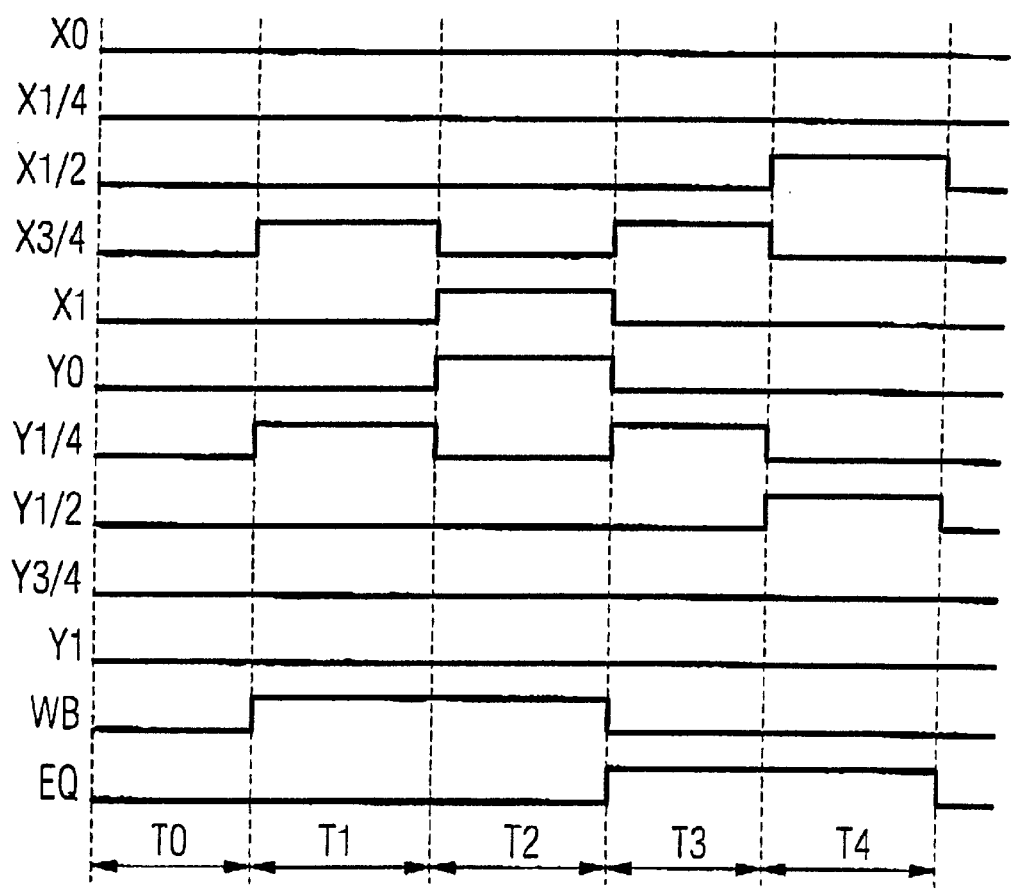

The sequence of control signals for the transistors 211, ..., 252 illustrated in FIG. 3 corresponds to a refresh operation for the case where the logic value "1" stored in the memory cell 15 is to be refreshed on the non-inverted bit line 11. All the other level values to be refreshed of memory cells connected to the non-inverted bit line 11 and memory cells connected to the inverted bit line 12 can readily be derived in continuation of the principle described in connection with FIG. 3. The type of amplification to be carried out by the adiabatic amplifier 14 in a manner dependent on the level values to be refreshed is prescribed by the signal PD.

Figure 5:
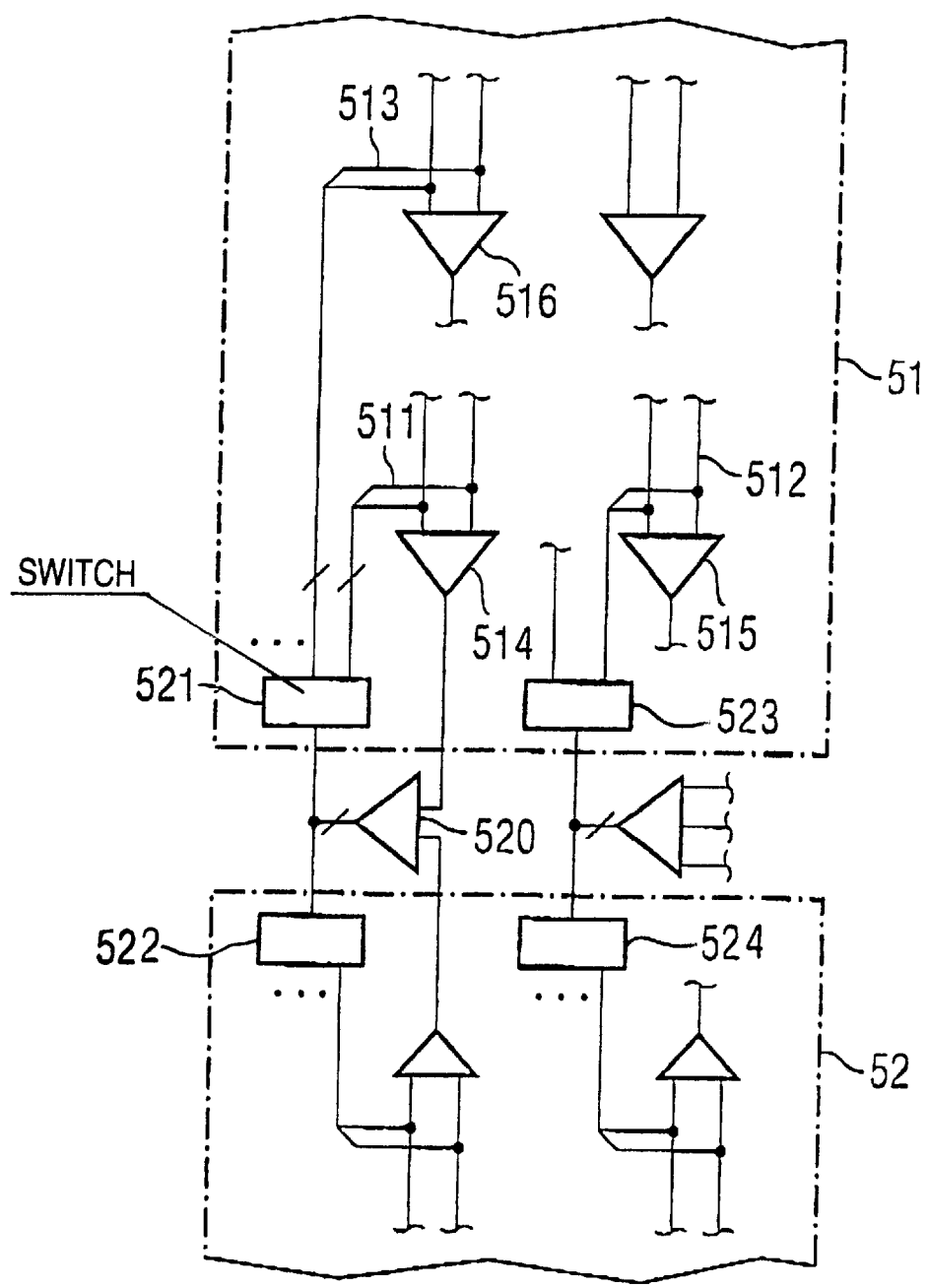
FIG. 5 is a fragmentary block and schematic circuit diagram of a semiconductor memory with jointly used adiabatic amplifiers according to the invention.

FIG. 5 shows a further detail from a semiconductor memory, having two memory blocks 51, 52. A multiplicity of bit line pairs 511, 512, 513 each connected to a sense amplifier 514, 515, 516 are illustrated in the memory block 51. The adiabatic bit line driver 520 is assigned to all bit line pairs of the first column, e.g., the bit line pairs 511, 513. On the input side, all the sense amplifiers of the first column drive the bit line driver 520, e.g., the sense amplifiers 514, 516. On the output side, switching devices 521, 522, 523, 524 are provided so that the respectively amplified signals are optionally written back in an amplified fashion to that bit line pair to which is connected the memory cell whose data value is currently to be restored. The switching device 521 is a demultiplexer, for example, which connects the output of the adiabatic amplifier 520 to one of the bit line pairs, e.g., 511 or 513. Furthermore, the adiabatic bit line driver may also be provided for refreshing the memory cells in the further memory cell block 52. The relatively long time available for a refresh is utilized in order to carry out the steps for the adiabatic amplification in accordance with FIG. 3 and, moreover, to use the adiabatic amplifier for driving different bit line pairs within a memory block or within different memory blocks one after the other.

In FIG. 3, it is only during the phase T2 that a current flows from the positive supply voltage or the potential source for the high level UH. During the phase T2, the transistor 212 is in the on state and connects the non-inverted bit line to the terminal 213 for the high potential UH. Otherwise, charge is carried away either to the terminal 223 for the low level UL or for charge reversal into one of the capacitors 233, 243, 253. During the phase T2, the bit line capacitance CBL is charged only by a quarter of the level swing, namely from the level U3/4 to the level UH. Therefore, the current consumption is limited to a quarter of the previous current consumption compared with the embodiment illustrated in FIG. 4. Therefore, the exemplary embodiment illustrated in the figures makes it possible to use dynamic semiconductor memories for long-term data retention in battery-operated devices.

The adiabatic amplifier illustrated in FIG. 2 can be modified. By way of example, for the implementation of the adiabatic principle, it suffices to use only three of the illustrated current paths 21, 22, 23. Because fewer intermediate levels are generated during the charge reversal in this case compared with FIG. 2, more power loss is consumed. However, the outlay on circuitry is reduced. In continuation of the principle shown in FIG. 3, further correspondingly constructed current paths can be connected in parallel, each including a transistor and a grounded capacitor. In such a case, it is possible to generate even more intermediate levels lying within the levels UH, UL. By way of example, four further comparable current paths can be connected in parallel, so that a total of nine parallel current paths form the adiabatic amplifier. Even further power loss is then saved compared with the case illustrated in FIG. 2. The charging operation that leads to the high level UH and is fed from the supply voltage representing the high level must equalize a smaller level swing compared with the exemplary embodiment illustrated in FIG. 2. Overall, despite the increased outlay on circuitry due to the adiabatic amplifier, power loss is saved and the outlay expended is justified.

I claim:

1. A semiconductor memory, comprising:

at least one memory cell;

a bit line connected to said memory cell;

a sense amplifier having an output, said sense amplifier:
   connected to said bit line;
   amplifying a signal read from said memory cell; and
   generating, at said output, an output signal derived from the signal; and an adiabatic amplifier connected to said bit line and to said output and driven by the output signal of said sense amplifier to write back the signal read from said memory cell to said memory cell in amplified form dependent upon the output signal of said sense amplifier.

2. The semiconductor memory according to claim 1, wherein:

said adiabatic amplifier has first and second output terminals;

a further bit line is connected to said sense amplifier; and said first and second output terminals of said adiabatic amplifier are respectively connected to said bit line and said further bit line.

3. The semiconductor memory according to claim 2, wherein:

said adiabatic amplifier has at least three current paths connected between said bit line and said further bit line;

each of said current paths has a series circuit of controlled paths of two transistors with a coupling node;

said coupling node of said transistors for two of said current paths is connected to a respective terminal for a supply potential; and a capacitive element is connected to said coupling node of said transistors for another of said current paths.

4. The semiconductor memory according to claim 3, wherein:

said transistors have control terminals; and a control device has an output side connected to said control terminals of said transistors to control an adiabatic amplification operation of complementary signals on said bit lines dependent upon the output signal of said sense amplifier.

5. The semiconductor memory according to claim 3, including:

further capacitive elements; and at least two further current paths connected between said first and second output terminals, each of said further current paths having two transistors with a coupling node, said two transistors connected in series by controlled paths, said coupling node connected to a respective one of said further capacitive elements.

6. The semiconductor memory according to claim 4, including:

further capacitive elements; and at least two further current paths connected between said first and second output terminals, each of said further current paths having two transistors with a coupling node, said two transistors connected in series by controlled paths, said coupling node connected to a respective one of said further capacitive elements.

7. The semiconductor memory according to claim 4, wherein:

said control device has a read-only memory and a counter connected to and driving said read-only memory; and said read-only memory has an output side connected to said control terminals of said transistors.

8. The semiconductor memory according to claim 1, wherein:

said sense amplifier is a plurality of sense amplifiers;

a plurality of bit line pairs are respectively connected to one of said sense amplifiers;

said adiabatic amplifier is a single adiabatic amplifier with an input side and an output side;

said input side of said single adiabatic amplifier is connected to said sense amplifiers;

said single adiabatic amplifier is driven by each of said sense amplifiers;

at least one controllable switching device is connected to said output side of said single adiabatic amplifier;

said switching device is connected to bit lines of said bit line pairs for connecting said output side of said single adiabatic amplifier to said bit lines of said bit line pairs; and said switching device is programmed to drive a respective one of said bit line pairs based upon the output signal from a respective one of said sense amplifiers connected to said one of said bit line pairs and fed to said single adiabatic amplifier by said single adiabatic amplifier through said switching device.

9. The semiconductor memory according to claim 1, wherein:

said sense amplifier is a plurality of sense amplifiers;

a plurality of bit line pairs are respectively connected to one of said sense amplifiers;

said adiabatic amplifier is a single adiabatic amplifier with an input side and an output side;

said input side of said single adiabatic amplifier is connected to said sense amplifiers;

said single adiabatic amplifier is driven by each of said sense amplifiers;

at least one controllable switching device is connected to said output side of said single adiabatic amplifier;

said switching device is connected to bit lines of said bit line pairs for connecting said output side of said single adiabatic amplifier to said bit lines of said bit line pairs; and for an output signal directly sent to said single adiabatic amplifier from one of said sense amplifiers connected to a respective one of said bit line pairs, said switching device is programmed to drive said one of said bit line pairs with said single adiabatic amplifier through said switching device.

10. The semiconductor memory according to claim 1, wherein:

said memory cell has a selection transistor and a storage capacitor; and said adiabatic amplifier refreshes a charge content of said storage capacitor.

11. A two-mode semiconductor memory, comprising:

at least one memory cell having a selection transistor and a storage capacitor;

a bit line connected to said memory cell;

a sense amplifier having an output, said sense amplifier:
 connected to said bit line;
 amplifying a signal read from said memory cell; and
 generating, at said output, an output signal derived from the signal;

an adiabatic amplifier connected to said bit line and to said output and driven by the output signal of said sense amplifier to write back the signal read from said memory cell to said memory cell in amplified form dependent upon the output signal of said sense amplifier;

said adiabatic amplifier refreshing a charge content of said storage capacitor; and a first operating mode carrying out a reading or writing access of a data value at said memory cell with a relatively high power loss consumption and a second operating mode refreshing the data value stored in said memory cell through said adiabatic amplifier with a relatively lower power loss consumption.

12. The semiconductor memory according to claim 11, wherein said second operating mode refreshes the data value with a relatively substantially lower power loss consumption.

13. A method for operating a semiconductor memory, which comprises:

providing a two-mode semiconductor memory having:
 at least one memory cell;
 a bit line connected to the memory cell;
 a sense amplifier having an output, the sense amplifier connected to the bit line; and
 an adiabatic amplifier connected to the bit line and to the output of the sense amplifier;

generating an output signal derived from the signal at the output of the sense amplifier;

in a first operating mode, amplifying a signal read from the memory cell with the sense amplifier and providing the signal at an external output terminal of the semiconductor memory; and in a second operating mode, feeding the output signal of the sense amplifier to the adiabatic sense amplifier to control, dependent upon the output signal of the sense amplifier, the adiabatic sense amplifier such that the signal read from the memory cell is written back to the memory cell again after adiabatic amplification.

14. The method according to claim 13, which further comprises:

carrying out the first operating mode as a normal operating mode of the memory; and carrying out the second operating mode as a power-saving mode of the memory, the power-saving mode having a relatively lower power loss compared to a power loss of the normal operating mode.

15. The method according to claim 13, wherein:

the first operating mode is a normal operating mode of the memory; and the second operating mode is a power-saving mode of the memory having a relatively lower power loss compared to a power loss of the normal operating mode.

* * * * *